United States Patent [19]

Asano et al.

[11] 4,417,323
[45] Nov. 22, 1983

[54] BUBBLE MEMORY CONDUCTOR PATTERN WITH HEAT SINK

[75] Inventors: Atsushi Asano, Tokyo; Masatoshi Takeshita, Hachioji; Hideki Nishida, Hinodemachi; Ryo Suzuki, Kokubunji; Toshio Futami, Mobara, all of Japan

[73] Assignee: Hitachi, Ltd., Tokyo, Japan

[21] Appl. No.: 234,630

[22] Filed: Feb. 17, 1981

Related U.S. Application Data

[63] Continuation of Ser. No. 959,505, Nov. 13, 1978.

Foreign Application Priority Data

Nov. 11, 1977 [JP] Japan ............................ 52-134667

[51] Int. Cl.³ .......................................... G11C 19/08
[52] U.S. Cl. ................................................ 365/1
[58] Field of Search ................... 365/1, 2, 19, 20, 21; 174/16 HS, 68.5, 74 R, 98; 338/51

[56] References Cited

U.S. PATENT DOCUMENTS 4,073,561  2/1978  Baranowski ............... 174/16 HS
4,334,290  6/1982  Hiroshima et al. .............. 365/1

FOREIGN PATENT DOCUMENTS 56-47984  4/1981  Japan ........................... 365/1

OTHER PUBLICATIONS

IBM Technical Disclosure Bulletin, vol. 12, No. 10, Mar. 1970, p. 1665.

Primary Examiner—James W. Moffitt
Attorney, Agent, or Firm—Antonelli, Terry & Wands

[57] ABSTRACT

A micro-pattern element has a heat discharge pattern formed on a fine line portion of a conductor pattern. Breakage caused by temperature elevation of the conductor pattern in response to the application of an electric current and resulting electromigration can be effectively prevented by the heat-discharge pattern formed on the fine line portion of the conductor pattern; thus, the reliability of the micro-pattern element can be remarkably improved.

18 Claims, 6 Drawing Figures

BUBBLE MEMORY CONDUCTOR PATTERN WITH HEAT SINK

This is a continuation of Ser. No. 959,505, filed Nov. 13, 1978.

BACKGROUND OF THE INVENTION

1. Field of the Invention

The present invention relates to a micro-pattern element having a micro-pattern provided on a substrate, such as for a magnetic bubble domain device.

2. Description of the Prior Art

In an element having a micro-pattern, such as for magnetic bubble domain devices, the breakage of a conductor pattern is a serious problem. With reference to FIG. 1, as is well known in the art, a magnetic bubble domain device has a structure in which a garnet film 11 is capable of storing a magnetic bubble, a first insulating film 12, a conductor pattern 13, a second insulating film 14 and a transfer pattern 15 are laminated successively on a non-magnetic substrate 10. (Although the magnetic bubble domain device further comprises a hard bubble controlling film, a detector, and a protecting film, these elements are not shown in FIG. 1 and it must be noted that FIG. 1 is provided for facilitating an understanding of the present invention.) In order to operate the magnetic bubble domain device, it is necessary to generate a magnetic bubble on the garnet film 11 by applying a pulsating current to the conductor pattern 13 or to erase such a magnetic bubble. When the application of pulsating currents is repeated for a long period of time for the generation or erasure of magnetic bubbles, due to current stresses caused by long period application of electric currents the local migration of atoms occurs and discontinuities are formed in the conductor pattern and finally, breakage of the conductor pattern takes place.

This undesirable phenomenon is ordinarily called "electro-migration". Various investigations have been made on the materials of conductors to be used for the formation of conductor patterns so as to prevent the occurrence of this phenomenon. For example, it is known that when Al-Cr or Al-Cu-Cr is employed, the life of the conductor pattern to the point of occurrence of breakage is prolonged and is much longer than the life attainable when Al alone is employed.

However, no satisfactory results can be obtained merely by improvements in the conductor material and it is impossible to completely prevent the occurrence of breakage owing to electro-migration only by improvements in the conductor material. Accordingly, further improvements in other aspects have been desired.

LIST OF THE PRIOR ART [37 CFR 1.56(a)]

The following references are cited to show the state of the art:

(1) J. R. Black, IE$^3$ Transactions on Electron Devices, Vol. EO-16, No. 4, pg. 338, 1969.

This article discloses that MTF owing to electro-migration is in proportion to $S \cdot e(E/RT)$, in which S stands for the cross-sectional area of the conductor and E designates the activated energy. However, this article does not describe a heat discharge pattern.

(2) Japanese Patent Application Laid-Open Specification No. 2239/74.

This specification discloses that the occurrence of electro-migration may be prevented by incorporating 1 to 54% by weight of Cu into Al. However, there is no description that a heat discharge pattern may be applied, so as to promote heat discharge.

SUMMARY OF THE INVENTION

It is a primary object of the present invention to solve the above-mentioned problem involved in the conventional techniques and to provide a micro-pattern element in which there is no risk of breakage in a conductor pattern.

In accordance with the present invention, a heat discharge pattern is applied to a desirable area of a conductor pattern to promote the heat discharge and moderate elevation of the temperature of the conductor pattern, whereby occurrence of electro-migration is effectively prevented.

DETAILED DESCRIPTION OF THE PREFERRED EMBODIMENTS:

When an electric current is applied to a conductor pattern, the temperature of the conductor pattern is elevated by Joule's heat. Needless to say, where the conductor line is fine and the resistivity is high, elevation of the temperature is conspicuous. Electro-migration is accelerated by an increase of the current density and elevation of the temperature. Accordingly, for example, for a conductor pattern as shown in FIG. 2(a), a conspicuous local elevation of the temperature takes place in a fine line portion 13' of a conductor pattern 13, and voids are readily formed in this portion and finally, breakage takes place in this portion.

The occurrence of this phenomenon may be prevented by increasing the line width of the fine line portion 13' to prevent local elevation of the temperature. However, although the intensity of the magnetic field in the bent part (hair-pin part) of the conductor line of the fine line portion 13' is a very important factor in a magnetic bubble domain device, if the line width in the fine line portion 13' is broadened, the intensity of the magnetic field at this part is changed and the function of the magnetic bubble domain device is lost. Therefore, broadening of the line width is not allowable.

Figure 1:
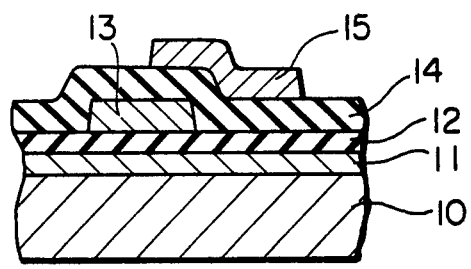
FIG. 1 is a partial sectional view illustrating the structure of a magnetic bubble domain device.
Figure 2A:
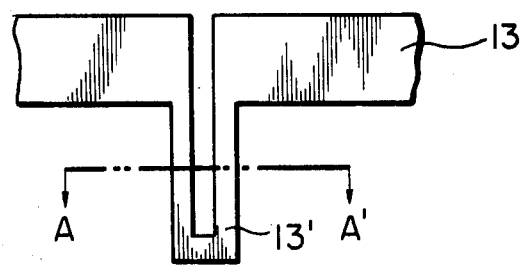
FIG. 2(a) is a plan view showing an instance of a fine line portion of a conductor pattern.
Figure 2B:
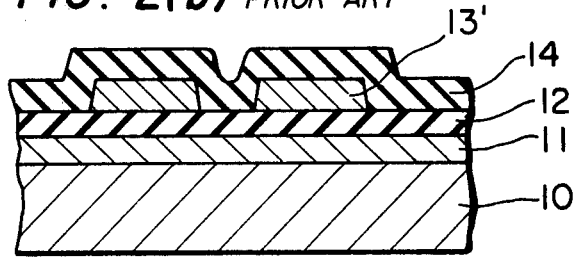
FIG. 2(b) is a partial sectional view of the fine line portion of FIG. 2(a)

FIG. 2(b) is a view showing the section A—A' of the fine line portion 13' of the conductor pattern 13 illustrated in FIG. 2(a). Elements, such as a transfer pattern, which are unnecessary for the illustration of the present invention are omitted from FIG. 2(b). The heat generated in the fine line portion 13' can be effectively discharged if diffusion of the heat through the conductor pattern, per se, and diffusion of the heat to insulating films 12 and 14 and substrate 10 are promoted, and hence, elevation of the temperature in the conductor pattern can be prevented and occurrance of electro-migration can be effectively controlled.

The present invention is based on this concept. More specifically, according to the present invention, a heat discharge pattern composed of a substance having a good thermal conductivity is applied to the fine line portion of a conductor pattern, whereby thermal degration is prevented without change of the intensity of the magnetic field in the hair-pin part.

The present invention will now be described in detail by reference to embodiments illustrated in the drawings.

Figure 3A:
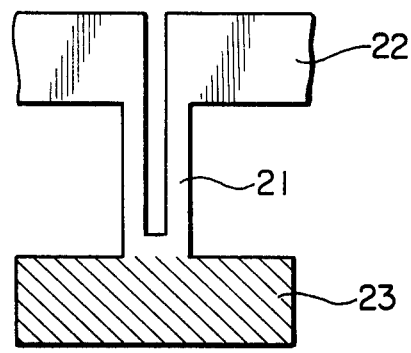
FIGS. 3(a), 3(b), and 3(c) are views illustrating different embodiments of the present invention.
Figure 3B:
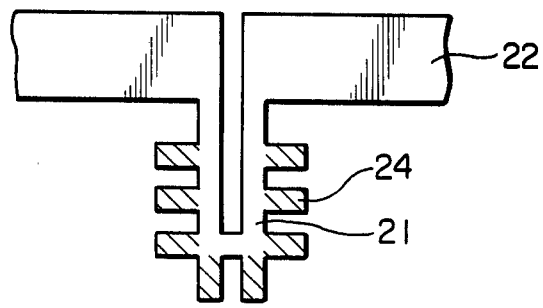
Figure 3C:
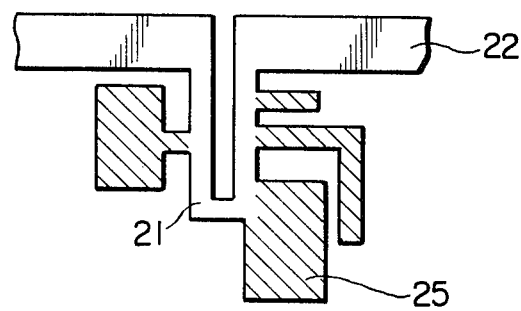

In different embodiments shown in FIGS. 3(a) through 3(c), heat discharge patterns 23 and 24 of differing shapes are applied to a fine line portion 21 of a conductor pattern.

The widths of a lead-in wire portion 22 and the fine line portion 21 in the conductor pattern are 20 $\mu$m and 5 $\mu$m, respectively, and the entire length of the line is about 95 $\mu$m. The sizes of the heat discharge patterns 23 and 24 are 75 $\mu$m $\times$ 20 $\mu$m and 10 $\mu$m $\times$ 5 $\mu$m, respectively (eight heat discharge patterns).

The conductor pattern shown in FIGS. 3(a) or 3(b) is formed on an SiO$_2$ film having a thickness of 1 mm by using Al containing 6% by weight of Cu(0.4 $\mu$m in thickness), and the conductor pattern is covered with a protecting SiO$_2$ film having a thickness of 0.7 $\mu$m. Thus prepared samples were subjected to a high temperature acceleration test using pulsating currents. The ambient temperature was 150° or 170° C. and the pulse width of the applied pulsating current was 0.1 $\mu$sec and the repetition time was 4 $\mu$sec. For comparison, a conductor pattern having no heat discharge pattern as shown in FIG. 2(a) (the widths of the fine line portion and lead-in wire portion were 5 $\mu$m and about 95 $\mu$m, respectively) was similarly formed, and subjected to the above-mentioned high temperature acceleration test.

Obtained results are shown in Table 1. As will be apparent from the results shown in Table 1, in each of the conductor patterns having no heat discharge pattern, the formation of voids or breakage may occur, whereas for conductor patterns having a heat discharge pattern, no change was observed.

TABLE 1

| Shape | Current | Temperature (°C.) | Time (hours) | Observation |
|---|---|---|---|---|
| FIG. 2(a) | Pulsating, 0.3A | 170 | 300 | formation of voids |
| FIG. 3(a) | Pulsating, 0.3A | 170 | 300 | no change |
| FIG. 3(b) | Pulsating, 0.3A | 170 | 300 | no change |
| FIG. 2(a) | Pulsating, 0.4A | 150 | 300 | many voids |
| FIG. 3(a) | Pulsating, 0.4A | 150 | 300 | no change |
| FIG. 3(b) | Pulsating, 0.4A | 150 | 300 | no change |
| FIG. 2(a) | Pulsating, 0.4A | 170 | 213 | breakage |

Note:
Pulse Width: 0.1 $\mu$sec
Repetition Time: 4 $\mu$sec

The fact that the formation of voids or the occurrence of breakage was not observed in the above high temperature acceleration test means that in a magnetic bubble domain device prepared according to the present invention, breakage of the conductor pattern is not caused for a long period of time (more than about 25 years). Therefore, the reliability of the magnetic bubble domain device can be remarkably improved according to the present invention. It has been confirmed that even if the shape of the heat discharge pattern 25 is not symmetric as shown in FIG. 3(c), good results can similarly be obtained.

The shape of the heat discharge pattern to be used in the present invention is not limited to those shown in FIGS. 3(a) through 3(c), but various other shapes can be adopted in the present invention. However, when a heat discharge pattern having a number of projections as shown in FIG. 3(b) is employed, an especially good heat discharge effect can be attained.

Of course, a higher heat discharge effect can be attained when the area of the heat discharge pattern is larger relatively to the area of the fine line portion of the conductor pattern. However, in some cases, a discharge pattern having a large area cannot be formed because of limitations of the shape of the fine line portion, the position of the heat discharge pattern and other factors.

In the embodiments shown in FIGS. 3(a) and 3(b), the surface areas of the heat discharge patterns 23 and 24 are three times and 0.8 time the area of the fine line portion of the conductor pattern, respectively. Good results are obtained in these embodiments as described above.

When a heat discharge pattern having the same surface area as that of the fine line portion is employed, the quantity of the discharged heat is twice the quantity of the heat discharged when no heat discharge pattern is formed and in this case, sufficiently satisfactory results are obtained in not only a magnetic bubble domain device but also other micro-fine pattern elements.

For the formation of the heat discharge pattern, there can be used Al and other metals having a good thermal conductivity and alloys thereof. This heat discharge pattern may be formed by using a material different from the material constituting the conductor pattern according to a separate process step, but when the heat discharge pattern is formed from the same material as that of the conductor pattern, the heat discharge pattern can be formed simultaneously with the conductor pattern by one process step and this method is most advantageous from a practical viewpoint.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. In a magnetic bubble memory device having a storage film capable of storing a magnetic bubble, an insulating film, a conductor pattern, and a transfer pattern successively provided on a non-magnetic substrate, the improvement comprising means for dissipating heat from said conductor pattern and including a heat discharge pattern formed of a thermally conductive substance thermally coupled with a fine line portion of said conductor pattern.

2. In a magnetic bubble memory device having a storage film capable of storing a magnetic bubble, an insulating film, a conductor pattern for conducting a pulsating current for the generation or erasure of a magnetic bubble in said storage film, said conductor pattern including a fine line portion having a line width set to create sufficient magnetic field intensities in response to said pulsating current for the generation or erasure of said magnetic bubble, and a transfer pattern successively provided on a non-magnetic substrate, the improvement comprising means for dissipating heat from said conductor pattern and including a heat discharge pattern formed of a thermally conductive substance adjacent to said fine line portion of said conductor pattern to prevent electromigration in said fine line portion of said conductor pattern.

3. The improvement according to claim 1 or 2, wherein said heat discharge pattern is contiguous with said conductor pattern.

4. The improvement according to claim 1 or 2, wherein said heat discharge pattern is contiguous with said fine line portion of said conductor pattern.

5. The improvement according to claim 1 or 2, wherein the surface area of said heat discharge pattern is from 0.8 times to 3 times the area of said fine line portion of said conductor pattern.

6. The improvement according to claim 1 or 2, wherein said storage film is a garnet film.

7. The improvement according to claim 1 or 2, wherein said heat discharge pattern is composed of the same material as said conductor pattern.

8. The improvement according to claim 7, wherein the conductor pattern and the heat discharge pattern are formed together in a single processing step, and wherein the thickness of the conductor pattern and the heat discharge pattern are the same.

9. The improvement according to claim 7, wherein the conductor pattern and the heat discharge pattern are formed together in a single processing step so that both are on a common plane on said insulating film.

10. In a magnetic bubble memory device having a storage film capable of storing a magnetic bubble, an insulating film, a conductor pattern, and a transfer pattern successively provided on a non-magnetic substrate, the improvement comprising means coupled with a fine line portion of said conductor pattern for preventing electro-migration in said fine line portion by discharging heat produced in said fine line portion which causes said electro-migration.

11. The improvement according to claim 10, wherein said electro-migration preventing means comprises a heat discharge pattern formed of a thermally conductive substance coupled with said fine line portion.

12. The improvement according to claim 11, wherein said heat discharge pattern has a surface area from 0.8 times to 3 times the area of said fine line portion of said conductor pattern.

13. The improvement according to claim 12, wherein said heat discharge pattern includes heat discharge regions coupled to both parallel side portions of said hair pin loop.

14. The improvement according to claim 1, 2 or 11, wherein said conductor pattern is formed as a hair pin loop having two parallel side portions and a tip portion joining said two parallel side portions, and wherein heat discharge pattern includes at least one discharge region coupled to one of the side portions of said hair pin loop.

15. The improvement according to claim 1, 2 or 10, wherein the conductor pattern and the heat discharge pattern are formed together in a single processing step with said heat discharge pattern being formed integrally with said conductor pattern.

16. In a magnetic bubble memory device having a storage film capable of storing a magnetic bubble, an insulating film, a conductor pattern for conducting a pulsating current for the generation or erasure of a magnetic bubble in said storage film, said conductor pattern including a fine line portion formed in the shape of a hair pin loop with two parallel side portions and a tip portion joining said two parallel side portions, said conductor pattern having a line width set to create sufficient magnetic field intensities in response to said pulsating current for the generation or erasure of said magnetic bubble, and a transfer pattern successively provided on a non-magnetic substrate, the improvement comprising means for preventing electro-migration in said fine line portion of said conductor pattern by discharging heat produced in said fine line portion which causes said electro-migration, said electro-migration preventing means comprising a heat discharge pattern formed integrally with said conductor pattern in a single processing step, wherein the surface area of said heat discharge pattern is from 0.8 times to 3 times the area of said fine line portion of said conductor pattern.

17. The improvement according to claim 16, wherein said heat discharge pattern includes at least one heat discharge region coupled to one of the side portions of said hair pin loop.

18. The improvement according to claim 16, wherein said heat discharge pattern includes heat discharge regions coupled to both parallel side portions of said hair pin loop.

* * * * *